United States Patent
Chen et al.

(10) Patent No.: US 10,732,740 B2
(45) Date of Patent: Aug. 4, 2020

(54) PRESSURE SENSING PATTERN LAYER COMPRISING PLURALITY OF PROTRUDING PORTIONS AND PRESSURE SENSING INPUT DEVICE INCLUDING THE SAME

(71) Applicant: TPK Touch Solutions (Xiamen) Inc., Xiamen (CN)

(72) Inventors: Feng Chen, Fuzhou (CN); Kunxiong Ye, Xiamen (CN); Xiaoli Qiu, Xiamen (CN)

(73) Assignee: TPK Touch Solutions (Xiamen) Inc., Xiamen (CN)

( * ) Notice: Subject to any disclaimer, the term of this patent is extended or adjusted under 35 U.S.C. 154(b) by 0 days.

(21) Appl. No.: 15/206,302

(22) Filed: Jul. 10, 2016

(65) Prior Publication Data
US 2017/0010704 A1    Jan. 12, 2017

(30) Foreign Application Priority Data

Jul. 10, 2015  (CN) .......................... 2015 1 0404409

(51) Int. Cl.
| | |
|---|---|
| *G06F 3/041* | (2006.01) |
| *G02F 1/1333* | (2006.01) |
| *G02F 1/1335* | (2006.01) |
| *G02F 1/1343* | (2006.01) |
| *G02F 1/1362* | (2006.01) |

(Continued)

(52) U.S. Cl.
CPC ............ *G06F 3/041* (2013.01); *G02F 1/1368* (2013.01); *G02F 1/13338* (2013.01); *G02F 1/13439* (2013.01); *G02F 1/133345* (2013.01); *G02F 1/133514* (2013.01); *G02F 1/133528* (2013.01); *G02F 1/134309* (2013.01); *G02F 1/136286* (2013.01); *G06F 3/044* (2013.01); *G06F 3/0412* (2013.01); *G06F 3/0414* (2013.01); *G06F 3/0416* (2013.01); *H05K 1/0296* (2013.01); *G02F 2001/133357* (2013.01); *G02F 2202/28* (2013.01); *G06F 2203/04102* (2013.01); *G06F 2203/04104* (2013.01);

(Continued)

(58) Field of Classification Search
CPC ....................... G06F 2203/04106; G06F 3/044
See application file for complete search history.

(56) References Cited

U.S. PATENT DOCUMENTS

2009/0252485 A1* 10/2009 Tsuchiya ............... G02B 3/0037
                                                                 396/200
2010/0301879 A1* 12/2010 Philipp ............... G06F 3/03547
                                                                 324/679

(Continued)

*Primary Examiner* — Yuzhen Shen
(74) *Attorney, Agent, or Firm* — Cooper Legal Group, LLC (57) ABSTRACT

A pressure sensing pattern layer is formed on a substrate and comprises a plurality of pressure sensing electrodes. Each of the pressure sensing electrodes comprises a plurality of protruding portions. The protruding portions are formed from a transparent conductive line which is bent zigzag. Each of the pressure sensing electrodes is electrically connected to a Wheatstone bridge circuit through a first conductive line and a second conductive line. A resistance of each of the pressure sensing electrodes is an element of the Wheatstone bridge circuit. When any of the pressure sensing electrodes is touched, a variation of the resistance of the touched pressure sensing electrode is detected by the Wheatstone bridge circuit.

20 Claims, 9 Drawing Sheets

(51) Int. Cl.
  *G02F 1/1368*  (2006.01)
  *G06F 3/044*  (2006.01)
  *H05K 1/02*  (2006.01)

(52) U.S. Cl.
  CPC ............. *G06F 2203/04105* (2013.01); *G06F 2203/04106* (2013.01); *G06F 2203/04111* (2013.01)

(56) References Cited

U.S. PATENT DOCUMENTS

| | | | | |
|---|---|---|---|---|
| 2012/0212434 A1* | 8/2012 | Bluemler | ............... | A61M 1/14 345/173 |
| 2013/0009905 A1* | 1/2013 | Castillo | .................. | G06F 3/044 345/174 |
| 2013/0141368 A1* | 6/2013 | Wang | ..................... | G06F 3/044 345/173 |
| 2013/0147739 A1* | 6/2013 | berg | ...................... | G06F 3/0488 345/173 |
| 2013/0181942 A1* | 7/2013 | Bulea | ..................... | G06F 3/044 345/174 |
| 2013/0271384 A1* | 10/2013 | Chuang | ................ | G06F 1/1643 345/173 |
| 2014/0020484 A1* | 1/2014 | Shaw | ..................... | G01L 1/146 73/862.625 |
| 2014/0055686 A1* | 2/2014 | Wu | ....................... | B82Y 30/00 349/12 |
| 2014/0062933 A1* | 3/2014 | Coulson | ................. | G06F 3/044 345/174 |
| 2014/0085253 A1* | 3/2014 | Leung | .................... | G06F 3/0414 345/174 |
| 2014/0152618 A1* | 6/2014 | Ando | ..................... | G06F 3/044 345/174 |
| 2014/0267128 A1* | 9/2014 | Bulea | ..................... | G06F 3/044 345/174 |
| 2014/0293145 A1* | 10/2014 | Jones | .................... | G06F 1/1626 349/12 |
| 2014/0313169 A1* | 10/2014 | Kravets | .................. | G06F 3/044 345/178 |
| 2014/0331741 A1* | 11/2014 | Shah | ....................... | G01N 3/30 73/12.06 |
| 2015/0002452 A1* | 1/2015 | Klinghult | ............. | G06F 3/0416 345/174 |
| 2015/0116260 A1* | 4/2015 | Hoen | ..................... | G06F 3/0414 345/174 |
| 2015/0193055 A1* | 7/2015 | Ando | ..................... | G06F 3/044 345/174 |
| 2015/0378493 A1* | 12/2015 | Kano | ..................... | G06F 3/044 345/173 |
| 2016/0103545 A1* | 4/2016 | Filiz | ....................... | G01L 1/18 345/174 |
| 2016/0109983 A1* | 4/2016 | Ando | ..................... | G06F 3/044 345/174 |
| 2016/0139717 A1* | 5/2016 | Filiz | ........................ | G01L 1/18 345/173 |
| 2016/0147352 A1* | 5/2016 | Filiz | ........................ | G01L 1/18 345/173 |
| 2016/0147353 A1* | 5/2016 | Filiz | ........................ | G01L 1/18 345/174 |
| 2016/0170543 A1* | 6/2016 | Kawamura | ......... | G06F 3/03547 345/174 |
| 2016/0190225 A1* | 6/2016 | Kim | ....................... | H01L 27/3276 257/40 |
| 2016/0195955 A1* | 7/2016 | Picciotto | ................ | G06F 3/044 345/174 |
| 2016/0231849 A1* | 8/2016 | Watazu | ................... | G06F 3/044 |
| 2016/0299625 A1* | 10/2016 | Kano | ..................... | G06F 3/0414 |
| 2016/0357331 A1* | 12/2016 | Kano | ..................... | G06F 3/044 |
| 2016/0378256 A1* | 12/2016 | Lee | ......................... | G06F 3/041 345/174 |

\* cited by examiner

FIG. 9

# PRESSURE SENSING PATTERN LAYER COMPRISING PLURALITY OF PROTRUDING PORTIONS AND PRESSURE SENSING INPUT DEVICE INCLUDING THE SAME

RELATED APPLICATIONS

This application claims priority to China Application Serial Number 201510044094, filed Jul. 10, 2015, which is herein incorporated by reference.

BACKGROUND

Field of the Disclosure

The present disclosure relates to a touch technology. More particularly, the present disclosure relates to a pressure sensing pattern layer and pressure sensing input device including the pressure sensing pattern layer.

Description of the Related Art

With the development of touch technology, touch panels with multiple functions are more and more popular by the people. The more prominent touch panel product is the one having both a touch sensing function and a pressure sensing function, and thus it can bring a better user experience. Because the touch panel has the pressure sensing function, a pressure sensing device is required to be disposed inside the touch panel. A general technique is to dispose the pressure sensing device at a non-display area of a capacitive touch screen, or a resistive touch screen, etc., for example, to dispose four pressure sensing devices at four corners of the touch screen. However, the aforementioned arrangement may only detect a single point of the pressure. The functions of the touch panel also may be constrained by a pressure sensing accuracy. Some structures of the touch panel may require a larger pressure to trigger the corresponding pressure sensing element, and thus the user experience is worse, and is likely to cause damage to the product.

A conventional resistive pressure sensing, pattern of a pressure sensing device on a non-display area is formed from a metal line. However, because the pressure sensing pattern has a small deformation when the pressure is small, it is hard to detect a resistance variation induced by the deformation of the pressure sensing pattern. Therefore, the pressure sensing pattern described above is not suitable for high precision requirements. Furthermore, the metal pressure sensing pattern is not transparent, and cannot be applied to a display area. Hence, what kind of arrangement of a pressure sensing electrode may bring a better sensing effect and is applicable to the display area is concerned by those skilled in the art.

In order to solve the aforementioned problems of poor sensing ability of the touch panel having, only single point pressure detected, or failing to be used in a display area, the present disclosure provides a pressure sensing pattern layer and a pressure sensing input device including the pressure sensing pattern layer to solve the above problems.

The disclosure herein provides a pressure sensing pattern layer. The pressure sensing pattern layer is formed on a substrate and includes a plurality of pressure sensing electrodes. Each of the pressure sensing electrodes includes a plurality of protruding portions. The protruding portions are formed from a transparent conductive line which is bent zigzag. Each of the pressure sensing electrodes is electrically connected to a Wheatstone bridge circuit through a first conductive line and a second conductive line. A resistance of each of the pressure sensing electrodes is an element of the Wheatstone bridge circuit. When any of the pressure sensing electrodes is touched, a variation of the resistance of the touched pressure sensing electrode is detected by the Wheatstone bridge circuit.

In some embodiments of the present disclosure, the protruding portions are protruded along at least two directions.

In some embodiments of the present disclosure, the protruding portions are distributed in an axially symmetric manner.

In some embodiments of the present disclosure, the protruding portions of each of the pressure sensing electrodes are comb shaped, saw-tooth shaped, radial shaped, or combinations thereof.

In some embodiments of the present disclosure, the pressure sensing electrodes are uniformly and symmetrically arranged in an array, or are arranged in a cruciform manner or an asterisk shaped manner.

In some embodiments of the present disclosure, each of the pressure sensing electrodes has a line width substantially in a range from 10 μm to 400 μm.

In some embodiments of the present disclosure, the pressure sensing electrodes are made of indium tin oxide (ITO), indium tin oxide doped Ag, silver nanowires, graphene, nano metal meshes, carbon nanotubes, or combinations thereof.

In some embodiments of the present disclosure, the first conductive line and the second conductive line are made of transparent indium tin oxide (ITO), silver nanowires, copper nanowires, nano metal meshes, graphene, polyaniline 3, 4-ethylenedioxythiophene (PEDOT), carbon nanotubes, or combinations thereof.

The disclosure herein provides a pressure sensing input device. The pressure sensing input device includes a cover plate, a substrate, and the aforementioned pressure sensing pattern layer. A cover plate has a first surface and a second surface respectively located at opposite sides of the cover plate, and the first surface is configured to receive a touch operation of a user. The pressure sensing pattern layer is disposed between the cover and the substrate, wherein the pressure sensing electrodes of the pressure sensing pattern layer are configured to detect strength of the touch operation on the cover plate.

In some embodiments of the present disclosure, the pressure sensing input device further includes a touched sensing layer. The touched sensing layer is located at a layer different from a layer on which the pressure sensing pattern layer is located. The touched sensing layer is configured to detect a position of the touch operation. The pressure sensing pattern layer is electrically isolated from the touched sensing layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosures feature of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Figure 1:
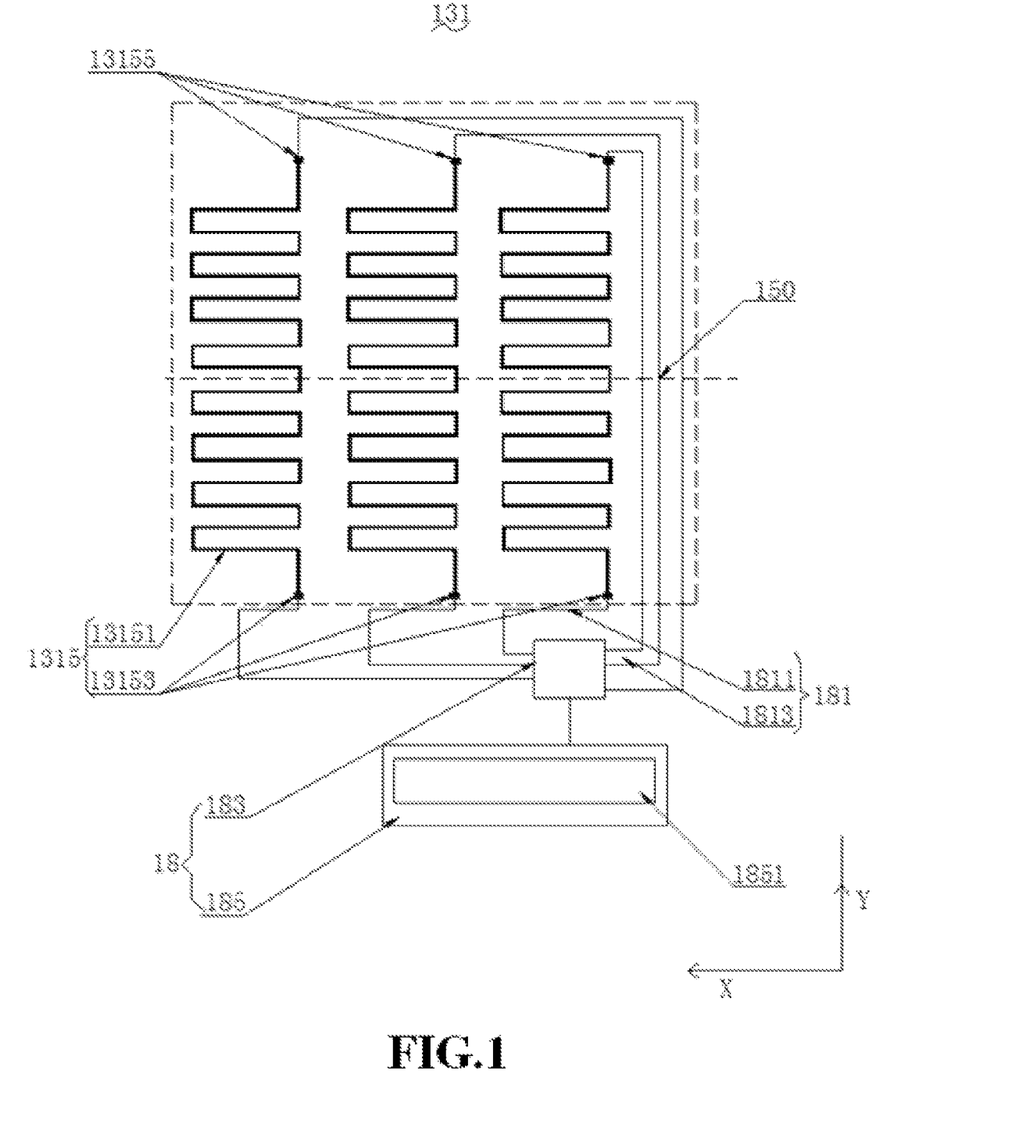
FIG. 1 is a schematic front view of a pressure sensing pattern layer in accordance with some embodiments of the present disclosure.

Reference is made to FIG. 1. FIG. 1 is a schematic front view of a pressure sensing pattern layer 131 in accordance with some embodiments of the present disclosure. The pressure sensing pattern layer 131 includes plural pressure sensing electrodes 1315 arranged in as parallel manner. The disclosure herein provides three pressure sensing electrodes 1315 for the following explanation. Each pressure sensing electrode 1315 includes plural protruding portions 13151. The pressure sensing electrodes 1315 is present in a zigzag shape, and the protruding portions 13151 of each pressure sensing electrode 1315 are equidistantly spaced from each other. Each pressure sensing electrode 1315 is formed from a transparent conductive line which is bent zigzag and forms as comb shape, wherein the bent portions of the pressure sensing electrodes 1315 respectively form the protruding portions 13151. The protruding portions 13151 of each pressure sensing electrode 1315 are respectively extended along the direction X and are repeatedly arranged in the direction Y. Furthermore, each pressure sensing electrode 1315 is distributed in an axially symmetric manner along the symmetry axis 150 in the direction X. Each pressure sensing electrode 1315 includes a first terminal portion 13153 and a second terminal portion 13155.

The pressure sensing electrodes 1315 of the pressure sensing pattern layer 131 are connected to a circuit system 18 which processes pressure signals detected by the pressure sensing electrodes 1315. The circuit system 18 includes plural conductive lines 181, a flexible printed circuit board 183, and a pressure sensing chip 185. The pressure sensing chip 185 includes a Wheatstone bridge circuit 1851. The conductive lines 181 are divided into a first conductive line 1811 and a second conductive line 1813. An end of the first conductive line 1811 is connected to the flexible printed circuit board 183, and the other end of the first conductive line 1811 is connected to a first terminal portion 13153 of the pressure sensing electrodes 1315. Similarly, a terminal portion of each second conductive line 1813 is connected to the flexible printed circuit board 183, and the other terminal portion of each second conductive line 1813 is connected to a second terminal portion 13155 of the pressure sensing electrodes 1315. The first conductive line 1811 and the second conductive lines 1813 are connected to the pressure sensing electrodes 1315, and further connected to the Wheatstone bridge circuit. 1851 through the flexible printed circuit board 183. The conductive lines 181 is made of a material, such as indium tin oxide (ITO), silver nanowires, copper nanowires, nano metal meshes, graphene, polyaniline, 3, 4-ethylenedioxythiophene (PEDOT), carbon nanotubes, or combinations thereof.

Figure 2:
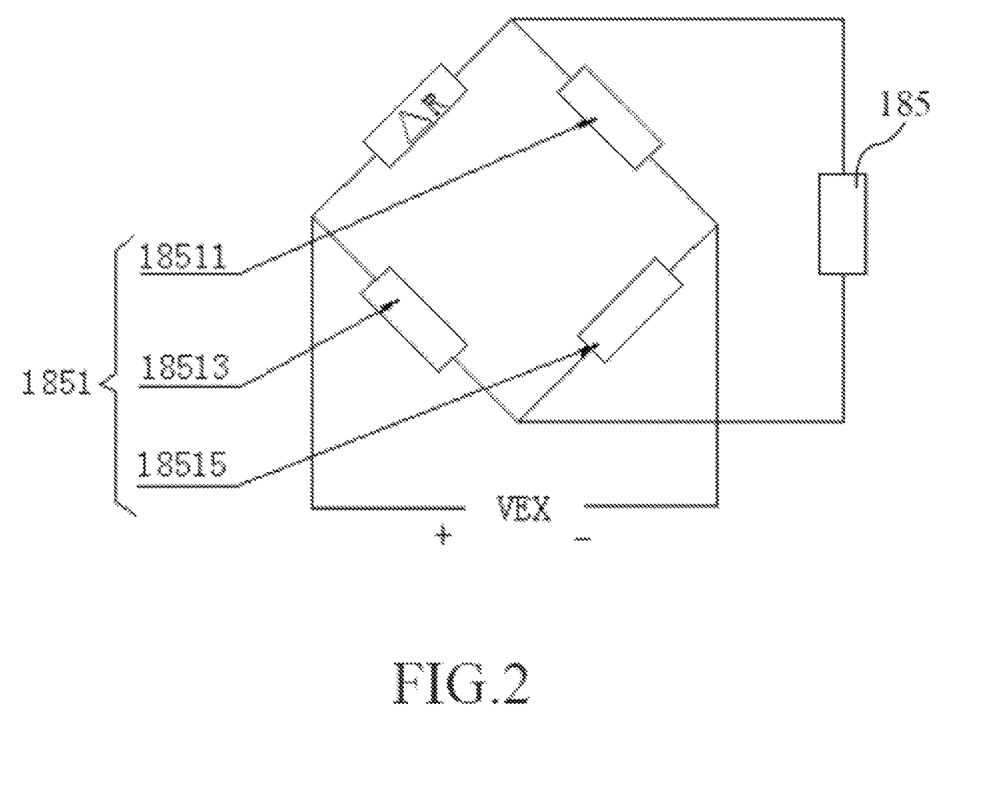
FIG. 2 is a schematic front view of the pressure sensing pattern layer in accordance with some embodiments of the present disclosure.

Reference is made to FIG. 2. The Wheatstone bridge circuit 1851 can detect a variation of the resistance of the touched pressure sensing electrode 1315. When a variation of the resistance of the touched pressure sensing electrode 1315 occurs, an auxiliary resistance (Ra) 18511, an auxiliary resistance (Rb) 18515, and an auxiliary resistance (Rc) 18153 of the Wheatstone bridge circuit 1851 connected in series and in parallel can detect the variation of the resistance, wherein the driving voltage of the Wheatstone bridge circuit 1851 is referred to as VEX. A variation of signal induced by the variation of the resistance is transmitted to the pressure sensing chip 185. $\Delta R$ in FIG. 2 is referred to as the variation of the resistance of the touched pressure sensing electrode 1315. Because the variation of the resistance of the touched pressure sensing electrode 13115 is relatively small after the touched pressure sensing electrode 1315 performs a touch action, the Wheatstone bridge circuit 1851 detects a variation of the resistance of the touched pressure sensing electrode 1315, and other circuit modules of the pressure sensing chip 185 may conduct other processes, such as signal amplification, for processing the subsequent signals conveniently.

The function of pressure sensing of the pressure sensing pattern layer 131 is based on a variation of the resistance which depends on a deformation of the touched pressure sensing electrode 1315. Because the touched pressure sensing electrode 1315 is connected to the pressure sensing chip 185 through the conductive lines 181, a variation of the resistance of the pressure sensing electrodes 1315 is directly transmitted to the pressure sensing chip 185 through the flexible printed circuit board 183, thereby achieving a pressure sensing function. On the general condition, the deformation and the resistance of the touched pressure sensing electrode 1315 satisfy the following equation: $GF=(\Delta R/R)/(\Delta L/L)$. Wherein GF represents a gage factor, R represents an initial resistance of the touched pressure sensing electrode 1315, L represents an initial length of the touched pressure sensing electrode 1315, $\Delta R$ represents a variation of the resistance of the touched pressure sensing electrode 1315, and $\Delta L$ represents a variation of the length of the touched pressure sensing electrode 1315. When the gage factor GF, the initial resistance R, and the initial length L are fixed, the larger variation of the length $\Delta L$ leads to the better detecting capability of the variation of the resistance $\Delta R$. Furthermore, the gage factor OF has to be larger than 0.5, thereby enabling the pressure sensing pattern layer 131 to receive the better sensory effect.

The line width of the pressure sensing electrode 1315 is generally in a range from 10 μm to 400 μm, thereby enabling the pressure sensing electrode 1315 to generate a larger variation of the resistance of the touched pressure sensing electrode 1315. The form of the pressure sensing pattern layer 131 generally is a rectangular plane. The ratio of the orthogonal projection of the pressure sensing electrode 1315 on the pressure sensing pattern layer 131 to the area of the superficial layer is in a range from 1% to 20%. Specifically, in a product, the area of the orthogonal projection of the pressure sensing electrode 1315 generally is in a range from 36 mm2 to 196 mm$^2$. In general, the line width of the pressure sensing electrode 1315 is in a range from 10 μm to 400 μm.

The pressure sensing electrode 1315 is made of indium tin oxide (ITO), indium tin oxide doped Ag, silver nanowires, graphene, nano metal meshes, carbon nanotubes or combinations thereof. The temperature coefficient of resistivity of the indium tin oxide at room temperature is about −650 ppm/° C. due to the indium tin oxide has a negative temperature coefficient of resistivity. Furthermore, the Silver (Ag) and most metals have a positive temperature coefficient of resistivity which is 3800 ppm/° C. at room temperature. Once the doping of the silver (Ag) is about 25 at %, the pressure sensing electrode 1315 may receive the best conversion efficiency of a resistance from its deformation, in which the temperature coefficient of resistivity is about 130 ppm/° C. at a temperature from 300° C. to 600° C. which is about one fifth of the one with no silver (Ag) doping. Therefore, the indium tin oxide (ITO) with silver (Ag) doping may reduce the noise interference on the resistance of indium tin oxide (ITO) effected by the temperature.

Figure 3:
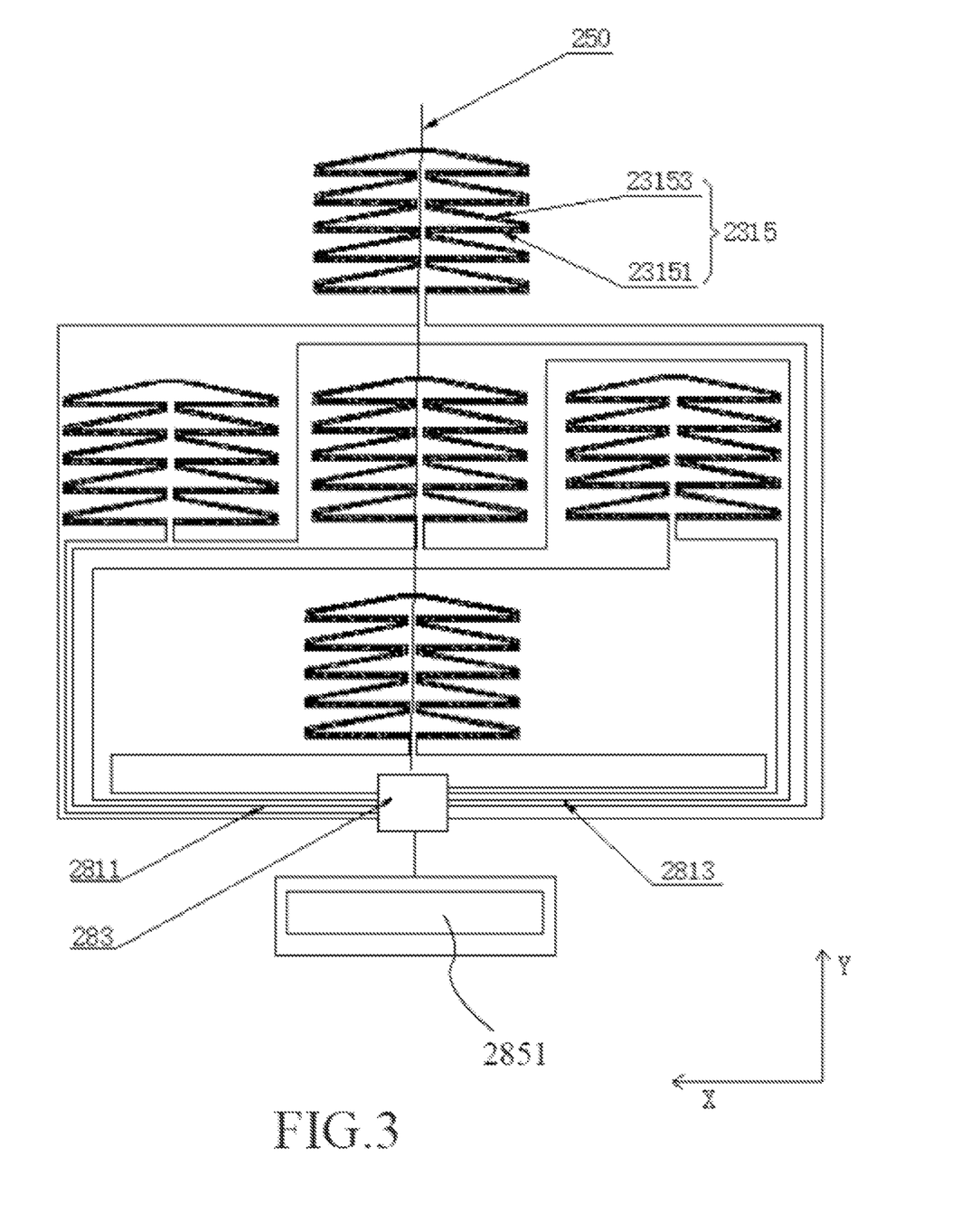
FIG. 3 is a schematic front view of a pressure sensing pattern layer in accordance with some embodiments of the present disclosure.

Reference is made to FIG. 3. FIG. 3 is a schematic front view of a pressure sensing pattern layer 231 in accordance with some embodiments of the present disclosure. The pressure sensing pattern layer 231 includes plural pressure sensing electrodes 2315. The pressure sensing electrodes 2315 are arranged in a cruciform manner. Each pressure sensing electrode 2315 is a zigzag transparent conductive line, and is bilaterally symmetry to a symmetrical axle 250 of the direction Y. The zigzag shaped has plural triangular bending which are arranged zigzag along the direction Y. In FIG. 3, the pressure sensing electrode 2315 includes plural straight edges 23151 and plural bevel edges 23153. Each straight edge 23151 and each bevel edge 23153 forms a protruding portion of the pressure sensing electrode 2315. Distances between every two adjacent ones of the straight edges 23151 are substantially equal, and orientations and sizes of the straight edges 23151 are substantially the same. Furthermore, orientations and widths of the bevel edges 23153 are also substantially the same. The protruding portions of the pressure sensing electrode 2315 are bent and protruded in both directions along left and right of the symmetrical axle 250, and are repeatedly arranged along direction Y. The pressure sensing electrode 2315 is distributed symmetrically, and its two ends are connected to a flexible printed circuit board 283 through the first conductive line 2811 and the second conductive lines 2813 respectively. Thereafter, the pressure sensing electrode 2315 is connected to the Wheatstone bridge circuit 2851 through the flexible printed circuit board 283.

Figure 4:
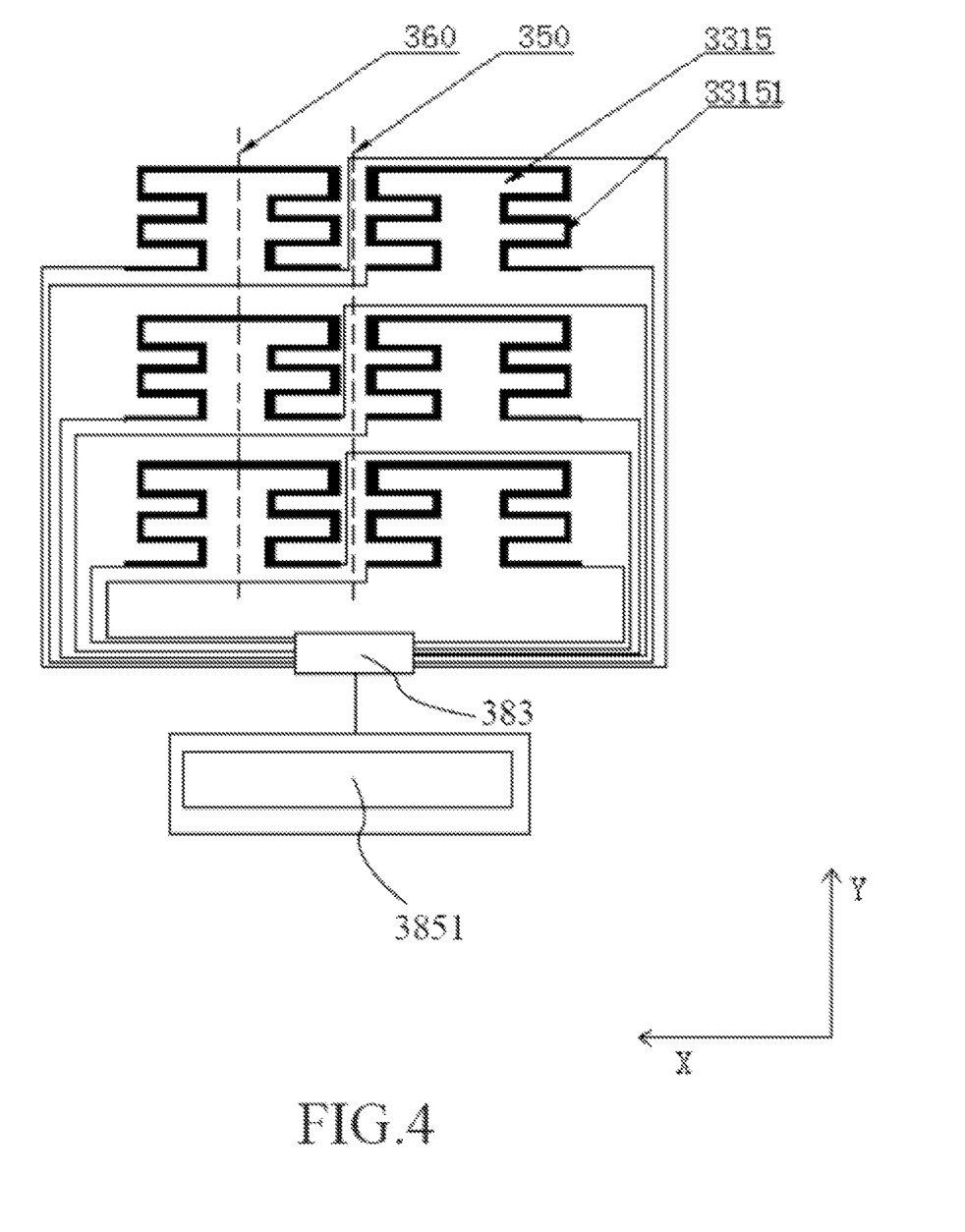
FIG. 4 is a schematic front view of a pressure sensing pattern layer in accordance with some embodiments of the present disclosure.

Reference is made to FIG. 4. FIG. 4 is a schematic front view of a pressure sensing pattern layer 331 in accordance with some embodiments of the present disclosure. The pressure sensing pattern layer 331 include plural pressure sensing electrodes 3315. The disclosure herein provides three pressure sensing electrodes 3315 arranged parallel along direction Y to the following description. A distance between any two adjacent one of the pressure sensing electrodes 3315 is equal. In this embodiment, the pressure sensing electrode 3315 is to form from two of a half fishbone shape, and two of the half fishbone shape are distributed in an axially symmetric manner along the symmetry axis 350 in the direction Y. Each of the half fishbone shape includes plural protruding portions 33151. Each protruding portion 33151 has the same convex manner and size and is formed in a half fishbone shape, and thus is symmetric with respect to the symmetrical axle 360 in direction Y. The protruding portions 33151 are protruded in both horizontal directions along left and right of the symmetrical axle 360. The pressure sensing electrode 3315 is connected to the Wheatstone bridge circuit 3851 through the flexible printed circuit board 383.

Figure 5:
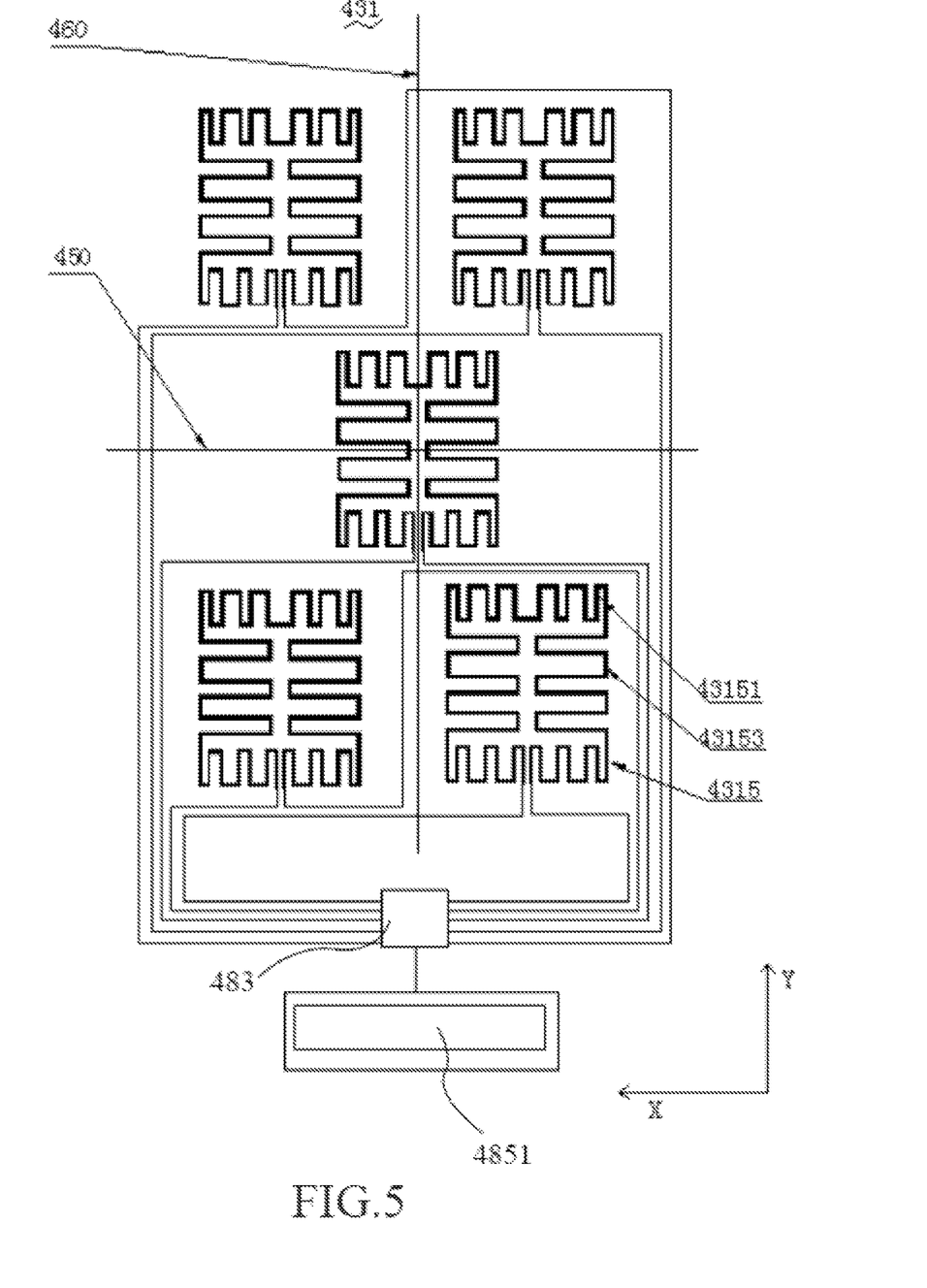
FIG. 5 is a schematic front view of a pressure sensing pattern layer in accordance with some embodiments of the present disclosure.

Reference is made to FIG. 5. FIG. 5 is a schematic front view of a pressure sensing pattern layer 431 in accordance with some embodiments of the present disclosure. The pressure sensing pattern layer 431 include plural pressure sensing electrodes 4315, and the pressure sensing electrodes 4315 are arranged in an asterisk shaped manner. The disclosure herein provides one pressure sensing electrode 4315 for the following description. The pressure sensing electrode 4315 is formed from a transparent conductive line which is bent zigzag. The protruding portions 43153 are protruded in both directions along left and right of the symmetrical axle 460, and in both directions along above and underneath of the symmetrical axle 450. That is, the pressure sensing electrode 4315 includes protruding portions 43151 and 43153 protruding along four directions. In FIG. 5, the pressure sensing pattern layer 431 is symmetric with respect to the symmetrical axle 450 in direction X, and is symmetric with respect to the symmetrical axle 460 in direction Y. The pressure sensing electrode 4315 is connected to the Wheatstone bridge circuit 4851 through the flexible printed circuit board 483.

Figure 6:
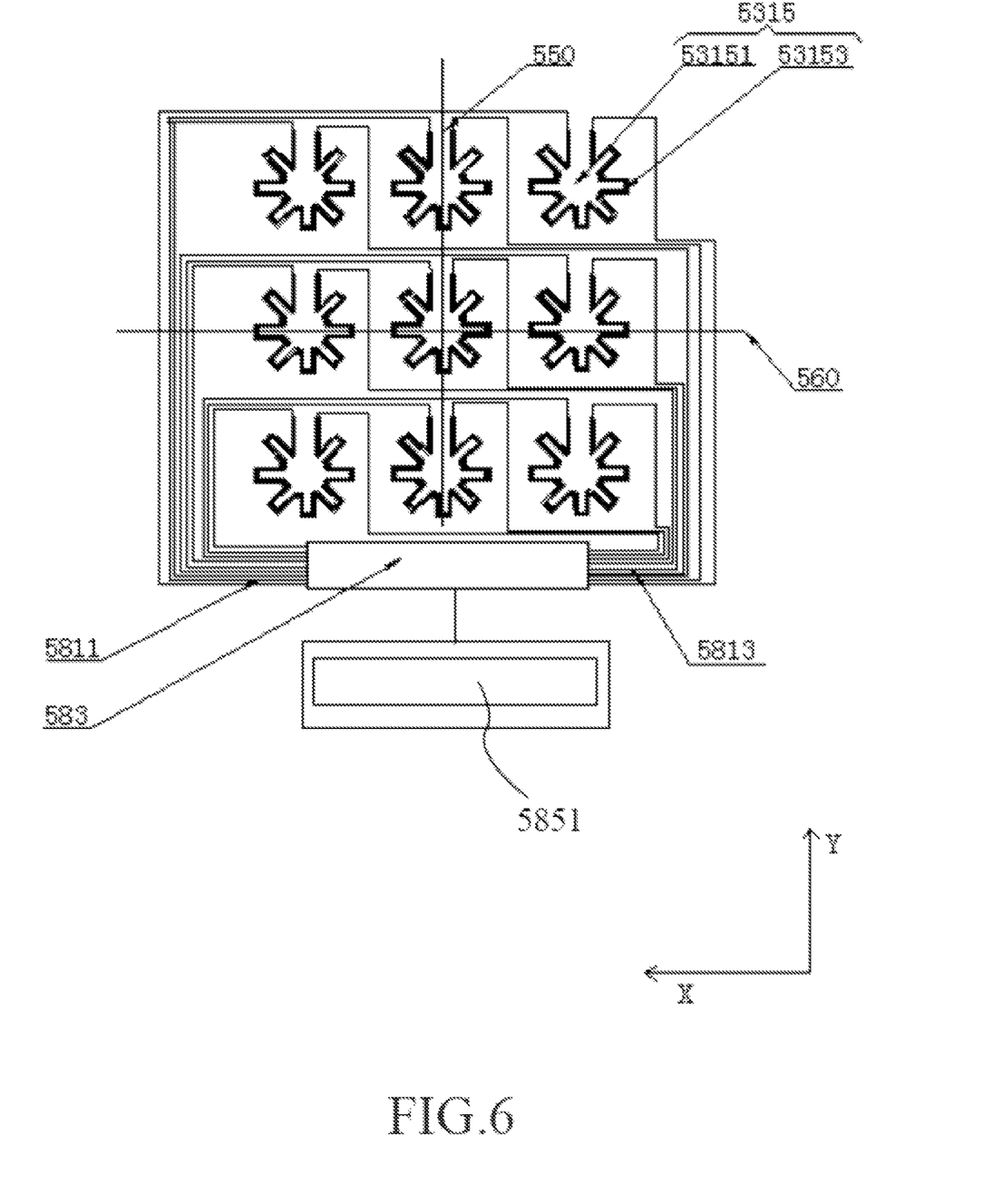
FIG. 6 is a schematic front view of a pressure sensing pattern layer in accordance with some embodiments of the present disclosure.

Reference is made to FIG. 6. FIG. 6 is a schematic front view of a pressure sensing pattern layer 531 in accordance with some embodiments of the present disclosure. The pressure sensing pattern layer 531 include plural pressure sensing electrodes 5315. The disclosure herein provides pressure sensing electrodes 3315 arranged in a 3×3 array for the following description. The three rows of the pressure sensing electrodes 5315 are separated from each other at the same distance, and the three columns of the pressure sensing electrodes 5315 are also separated from each other at the same distance. The three pressure sensing electrodes 5315 in each column are independent from each other and are respectively connected to the flexible printed circuit board 583 through the first conductive line 5511 and the second conductive lines 5813. Then, the flexible printed circuit board 583 is connected to the Wheatstone bridge circuit 5851.

Each of the pressure sensing electrodes 5315 is in a radial shape, and the shape is extended to several directions. The pressure sensing electrode 5315 includes a central portion 53151 and plural protruding portions 53153. The protruding portions 53153 are separated from each other at the same distance and extended from the central portion 53151, and each of the protruding portions 53153 has the same length. When strength of the touch operation by a user is reacted by a pressure surface, a central portion 53151 may receive the strongest strength, and the strength is decreasing and divergent outwards from the central portion 53151. The pattern of the pressure sensing electrodes 5315 is coincident with the distributed manner of a force diagram of the touch force exerted on the electrode. Hence, the pattern advantageously increases a deformed sensitivity when the pressure sensing electrodes 5315 receive the touch force. Furthermore, the pressure sensing electrodes 5315 are symmetric with respect to the symmetrical axle 550 in direction Y.

Figure 7:
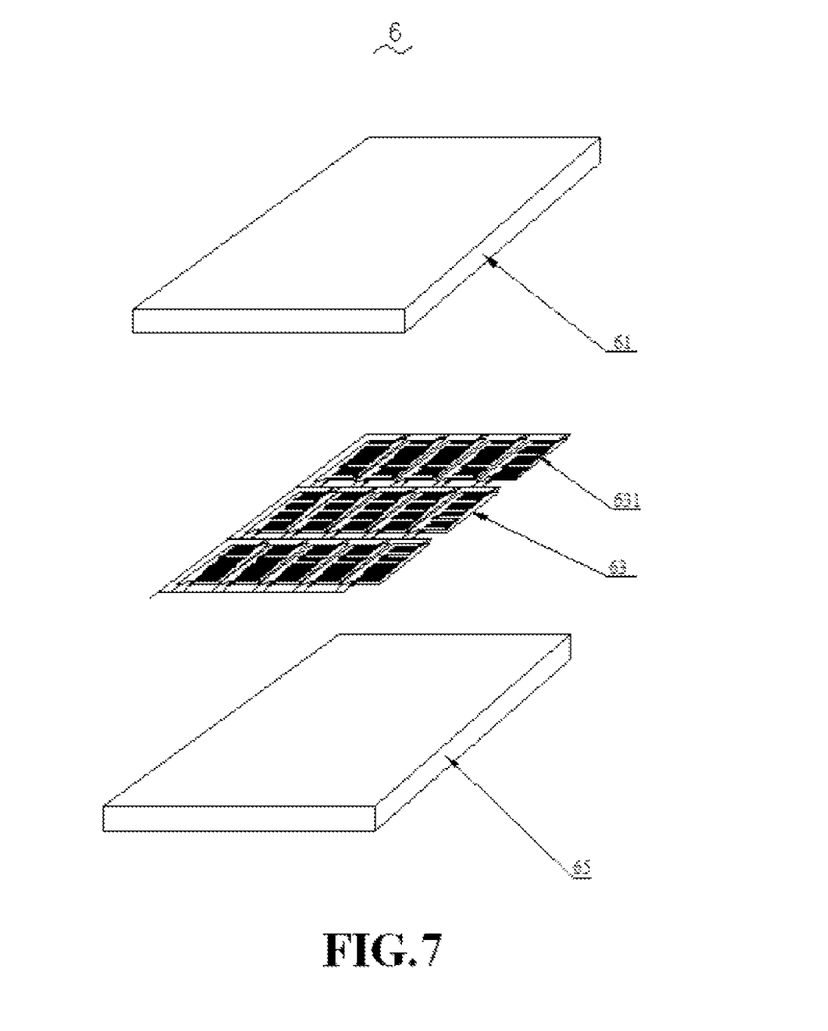
FIG. 7 is a schematic exploded view of a pressure sensing input device in accordance with some embodiments of the present disclosure.

Reference is made to FIG. 7. FIG. 7 is a schematic exploded view of a pressure sensing input device 6 in accordance with some embodiments of the present disclosure. The pressure sensing input device 6 includes a cover plate 61, an electrode layer 63, and a substrate 65. The cover plate 61 has a first surface and a second surface respectively located at opposite sides of the cover plate 61. The first surface is configured to receive a touch operation of a user. The electrode layer 63 is disposed between the cover plate 61 and the substrate 65. The pressure sensing electrode pattern 631 is formed in the electrode layer 63. The pressure sensing electrode patterns 631 are any one of the aforementioned embodiments.

The cover plate 61 is made of a reinforcing hardboard, such as hard plastic, tempered glass, or sapphire glass. The substrate 65 is made of a rigid substrate, such as glass, tempered glass, or sapphire glass. The substrate 65 also is made of a flexible substrate, such as polyetheretherketone (PEEK), polyimide (PI), polyethylene terephthalate (PET), polycarbonate (PC), polyethylene succinate (PES), polymethylmethacrylate (PMMA), or combinations of any two thereof.

Figure 8:
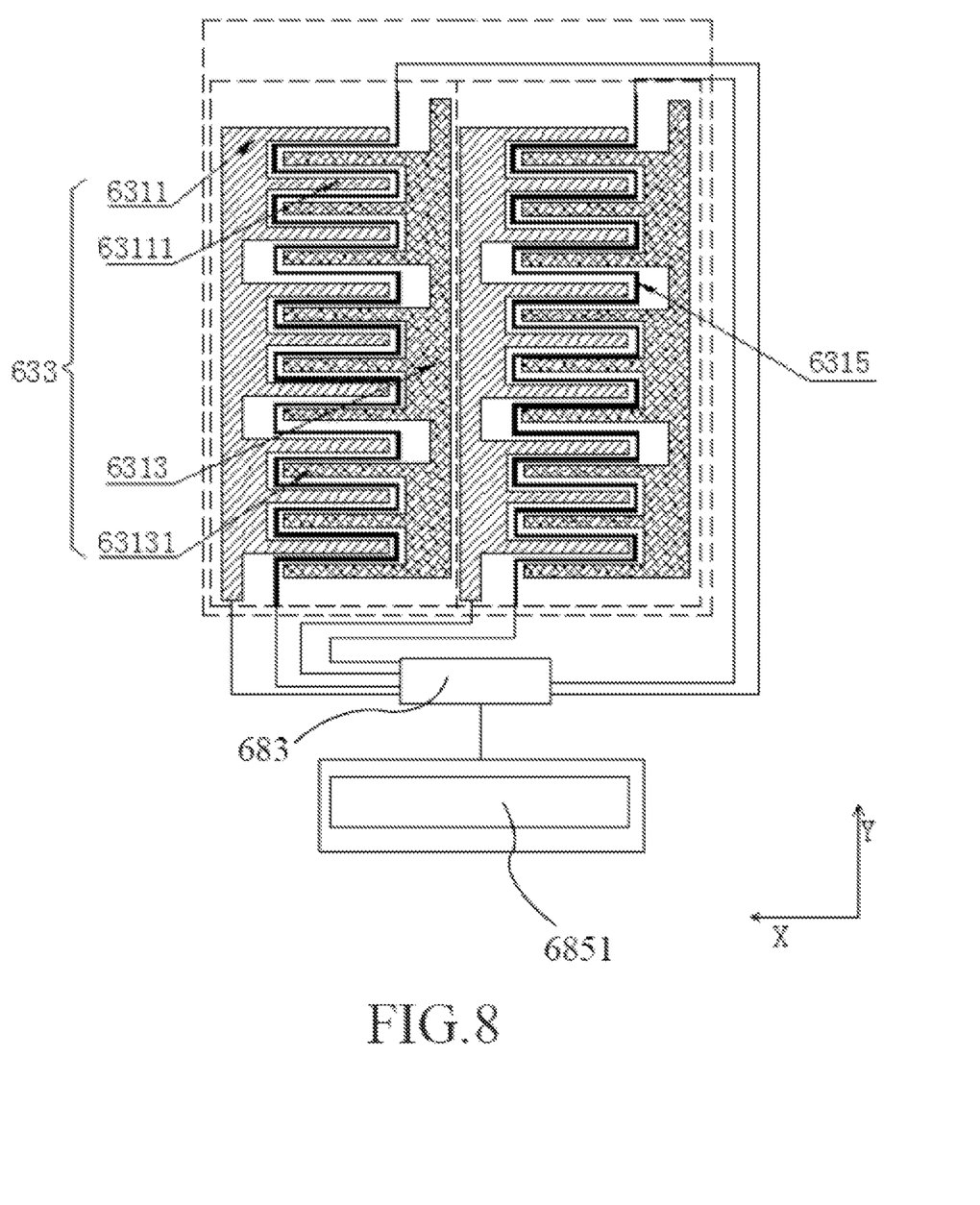
FIG. 8 is a schematic front view of a pressure sensing input device in accordance with some embodiments of the present disclosure.

Reference is made to FIG. 8. A plurality of touched sensing electrode pattern layers 633 are disposed on an electrode layer 63. Each touched sensing electrode pattern layer 633 includes a first touched sensing electrode 6311 and a second touched sensing electrode 6313. Each pressure sensing electrode pattern layer 631 (as shown in FIG. 7) includes plural pressure sensing electrodes 6315. The pressure sensing electrode 6315 is used as the pressure sensing electrode 1315 in the first embodiment. The first touch sensing electrode 6311 and the second touch sensing electrode 6313 are formed on a non-pressure sensing zone of the substrate 65 (not shown). The pressure sensing electrodes 6315 are formed on a pressure sensing zone of the substrate 65 (not shown). The pressure sensing zone and the non-pressure sensing zone are designed with complementary. That is, an area of the conductive layer is the sum of areas of the pressure sensing zone and the non-pressure sensing, zone.

The first touched sensing electrode 6311 and the second touched sensing electrode 6313 respectively include plural first protruding portions 63111 and plural second protruding portions 63131 both of which are extended along the direction X. The first protruding portions 63111 and the second protruding portions 63131 are staggered each other and complement each other in the touched sensing electrode pattern layer 633. The first protruding portions 63111 and the second protruding portions 63131 are disposed at regular intervals, and form a complementary pattern.

The pressure sensing electrode 6315 disposed zigzag in the pressure sensing zone is disposed in a gap (i.e. pressure sensing zone) which is formed between staggered complementary two of the first touch sensing electrode 6311 and the second touch sensing electrode 6313. The pressure sensing electrode 6315, the first touched sensing electrode 6311, and the second touched sensing electrode 6313 are not in contact with each other, and are configured to avoiding affecting the function of the pressure detection and the position of the touch operation. The zigzag modeling of the pressure sensing electrode 6315 can enhance capabilities of its deformation and its pressure sensing, thus improving the sensing accuracy. In order to obtain enough space for disposing the pressure sensing electrode 6315 and achieving a large variation of the resistance, the line widths of the first touch sensing electrode 6311 and the second touch sensing electrode 6313 are properly reduced during the process of production, and the line width of the pressure sensing electrode 6315 is controlled to be smaller than the line widths of the first touch sensing electrode 6311 and the second touch sensing electrode 6313. The numbers of the first protruding portion 63111 and the second protruding portion 63131 are not limited thereto.

The pressure sensing, zone and the non-pressure sensing zone are designed with complementary, and the first touch sensing electrode 6311 and the second touch sensing electrode 6313 in the non-pressure sensing zone also are designed with complementary. Hence, the first touch sensing electrode 6311, the second touch sensing electrode 6313, and the pressure sensing electrode 6315 is formed a non-cross pattern. The pressure sensing electrodes 6315 are connected to the Wheatstone bridge circuit 6851 through the flexible printed circuit board 683.

Figure 9:
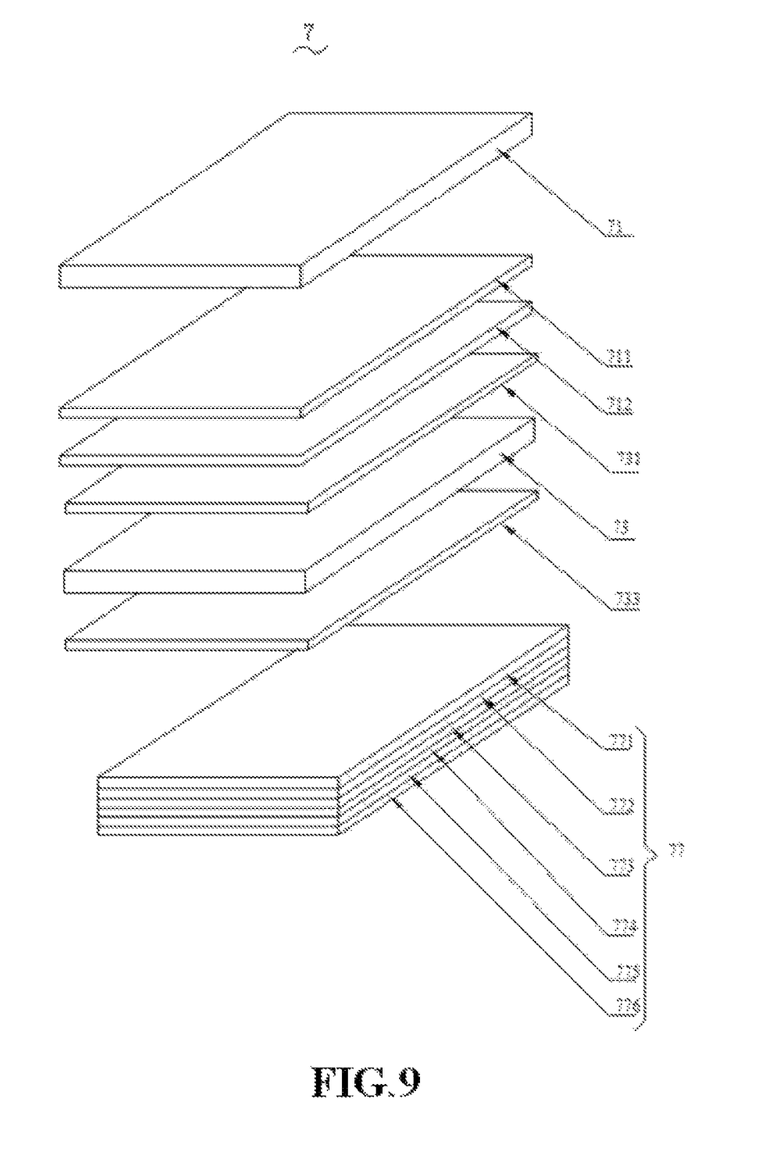
FIG. 9 is a schematic exploded view of a pressure sensing input device in accordance with some embodiments of the present disclosure.

Reference is made to FIG. 9. FIG. 9 is a schematic exploded view of a pressure sensing input device 7 in accordance with some embodiments of the present disclosure. The pressure sensing input device 7 from top to bottom includes a cover 71, a pressure sensing electrode layer 711, an insulating layer 712, a substrate 73, a first touched sensing electrode layer 731, a second touched sensing electrode layer 733, and a display panel 77. The substrate 73 is disposed between the first touched sensing electrode layer 731 and the second touched sensing electrode layer 733. The pressure sensing electrode layer 711 is disposed between the cover 71 and the insulating layer 712. The insulating layer 712 can prevent the touch sensing and the pressure sensing from being the electrically conducted. The disclosure herein is not limited to the type of the display panel 77. The display panel 77 can be formed from liquid crystal, organic light-emitting diode, or plasma.

For convenience of explanation, a liquid crystal display panel is used as an example hereinafter. The display panel 77 from top to bottom includes a top polarizer 771, a top substrate 772, a color filter layer 773, a liquid crystal layer 774, a driving layer 775, and a bottom substrate 776. The top polarizer 771 is disposed on the top substrate 772. The color filter layer 773 is disposed under the top substrate 772. The color filter layer 773 has plural color filters. The driving layer 775 is disposed on the bottom substrate 776. The driving layer 775 has plural thin film transistors. The liquid crystal layer 774 is disposed between the color fiber layer 773 and the driving layer 775.

The first touched sensing electrode layer 731, the pressure sensing electrode layer 711 or the second touched sensing electrode layer 733 is directly formed on a top surface of the top polarizer 771, and then the display panel 77 no longer needs the substrate 73. Furthermore, the first touched sensing electrode layer 731, the pressure sensing electrode layer 711 or the second touched sensing electrode layer 733 is formed between the color filter layer 773 and the liquid crystal layer 774, between the top polarizer 771 and the top substrate 772, between the liquid crystal layer 774 and the driving layer 775, between the driving layer 775 and the bottom substrate 776 or a bottom surface of the bottom substrate 776.

The pressure sensing electrodes 1315 of the pressure sensing pattern layer 131 of the present disclosure all include plural protruding portions 13151 compared with the prior art. The protruding portions 13151 are formed from a transparent conductive line which is bent zigzag, and are connected to the Wheatstone bridge circuit 1851 through the conductive lines 181. A resistance variation of the pressure sensing electrodes 1315 are detected by the Wheatstone bridge circuit 1851.

The protruding portions 13151 of each pressure sensing electrode 1315 are distributed in an axially symmetric manner which is configured to enlarge and homogenize the variation of the resistance of the pressure sensing electrodes 1315 and to detect the pressure signal more easily after the pressure sensing electrodes 1315 is touched. Once the protruding portions 13151 of each pressure sensing electrode 1315 are not distributed in an axially symmetric manner, an user may touch a region which has fewer protruding portions 13151, and thus the pressure signals may too weak to be detected.

The pressure sensing electrodes 1315 are uniformly and symmetrically arranged in an array. The protruding portions 13151 of each of the pressure sensing electrodes 1315 are selected to be comb shaped, saw-tooth shaped, radial shaped, or other zigzag shaped, and the sizes and line widths of the pressure sensing electrodes 1315 are selected thereby enlarging the variation of the resistance of the pressure sensing electrodes 1315, thus detecting the pressure signal more easily.

The sensing input device having the aforementioned pressure sensing pattern layer has the aforementioned advantageous effects regardless if the touched sensing layer is dual indium tin oxide structure, single Indium tin oxide structure or a non-cross structure.

The sensing input display device having the aforementioned pressure sensing pattern layer has the aforementioned advantageous effects regardless if the stacked layer in which the touched sensing layer is located is an in-cell structure or an on-cell structure.

The foregoing outlines features of several embodiments so that those skilled in the art may better understand the aspects of the present disclosure. Those skilled in the art should appreciate that they may readily use the present disclosure as a basis for desiring or modifying other processes and structures for carrying out the same purposes and/or achieving the same advantages of the embodiments introduced herein. Those skilled in the an should also realize that such equivalent constructions do not depart from the spirit and scope of the present disclosure, and that they may make various changes, substitutions, and alterations herein without departing from the spirit and scope of the present disclosure.

What is claimed is:

1. A pressure sensing input device, comprising:
    a cover plate having a first surface and a second surface respectively located at opposite sides of the cover plate, the first surface being configured to receive a touch operation of a user;
    a substrate;
    a pressure sensing pattern layer formed on the substrate and disposed between the cover plate and the substrate; and
    a first touch sensing electrode formed on the substrate, wherein:
        the pressure sensing pattern layer comprises a plurality of pressure sensing electrodes,
        the pressure sensing electrodes of the pressure sensing pattern layer are configured to detect a strength of the touch operation on the cover plate,
        each of the pressure sensing electrodes comprises a plurality of protruding portions,
        the protruding portions are formed from a transparent conductive line which is bent zigzag,
        each of the pressure sensing electrodes is electrically connected to a Wheatstone bridge circuit through a first conductive line and a second conductive line,
        a resistance of each of the pressure sensing electrodes is an element of the Wheatstone bridge circuit,
        when any of the pressure sensing electrodes is touched, a variation of the resistance of the touched pressure sensing electrode is detected by the Wheatstone bridge circuit,
        a first surface of the first touch sensing electrode faces a first pressure sensing electrode of the pressure sensing electrodes and a second surface of the first touch sensing electrode faces away from the first pressure sensing electrode,
        the first touch sensing electrode has a first width measured from the first surface to the second surface at a first location adjacent to a first protruding portion of the protruding portions,
        the first touch sensing electrode has a second width, different than the first width, measured from the first surface to the second surface at a second location adjacent to a second protruding portion of the protruding portions, and
        a width of a space between the first touch sensing electrode and the first protruding portion is different than a width of a space between the first touch sensing electrode and the second protruding portion.

2. The pressure sensing input device of claim 1, wherein the protruding portions are protruded along at least two directions.

3. The pressure sensing input device of claim 1, wherein the protruding portions is distributed in an axially symmetric manner.

4. The pressure sensing input device of claim 1, wherein the protruding portions of each of the pressure sensing electrodes are comb shaped, saw-tooth shaped, radial shaped, or combinations thereof.

5. The pressure sensing input device of claim 1, wherein the pressure sensing electrodes are uniformly and symmetrically arranged in:
    an array,
    a cruciform manner, or
    an asterisk shaped manner.

6. The pressure sensing input device of claim 1, wherein each of the pressure sensing electrodes has a line width in a range from 10 μm to 400 μm.

7. The pressure sensing input device of claim 1, wherein the pressure sensing electrodes are made of indium tin oxide (ITO), indium tin oxide doped Ag, silver nanowires, graphene, nano metal meshes, carbon nanotubes, or combinations thereof.

8. The pressure sensing input device of claim 1, wherein the first conductive line and the second conductive line are made of transparent indium tin oxide (ITO), silver nanowires, copper nanowires, nano metal meshes, graphene, polyaniline, 3, 4-ethylenedioxythiophene (PEDOT), carbon nanotubes, or combinations thereof.

9. The pressure sensing input device of claim 1, comprising:
    a second touch sensing electrode, wherein:
        the second touch sensing electrode and the first touch sensing electrode are disposed in a complementary pattern, and the second touch sensing electrode and the first pressure sensing electrode are interleaved with the first touch sensing electrode such that a third surface of the first touch sensing electrode, extending in a different direction than the first surface and the second surface, faces both the first pressure sensing electrode and the second touch sensing electrode.

10. A pressure sensing input device, comprising:
a first pressure sensing electrode;
a first touch sensing electrode, wherein:
the first pressure sensing electrode comprises a plurality of protruding portions,
a first surface of the first touch sensing electrode faces the first pressure sensing electrode and a second surface of the first touch sensing electrode faces away from the first pressure sensing electrode,
the first touch sensing electrode has a first width measured from the first surface to the second surface at a first location adjacent to a first protruding portion of the protruding portions, and
the first touch sensing electrode has a second width, different than the first width, measured from the first surface to the second surface at a second location adjacent to a second protruding portion of the protruding portions; and
a second touch sensing electrode, wherein:
the second touch sensing electrode and the first touch sensing electrode are disposed in a complementary pattern,
the second touch sensing electrode and the first pressure sensing electrode are interleaved with the first touch sensing electrode such that a third surface of the first touch sensing electrode, extending in a different direction than the first surface and the second surface, faces both the first pressure sensing electrode and the second touch sensing electrode, and
the first touch sensing electrode, the second touch sensing electrode, and the first pressure sensing electrode do not overlap in a direction perpendicular to a top surface of a substrate upon which the first touch sensing electrode, the second touch sensing electrode, and the first pressure sensing electrode are formed.

11. The pressure sensing input device of claim 10, wherein a width of a space between the first touch sensing electrode and the first protruding portion is different than a width of a space between the first touch sensing electrode and the second protruding portion.

12. A pressure sensing input device, comprising:
a pressure sensing pattern layer formed on a substrate;
a first touch sensing electrode formed on the substrate; and
a second touch sensing electrode formed on the substrate, wherein:
the pressure sensing pattern layer comprises a plurality of pressure sensing electrodes,
each of the pressure sensing electrodes comprises a plurality of protruding portions,
a width of a space between the first touch sensing electrode and a first protruding portion of the protruding portions that are part of a first pressure sensing electrode of the pressure sensing electrodes is different than a width of a space between the first touch sensing electrode and a second protruding portion of the protruding portions that are part of the first pressure sensing electrode,
the first protruding portion is disposed between the first touch sensing electrode and the second touch sensing electrode,
a first surface of the first touch sensing electrode faces the first pressure sensing electrode and a second surface of the first touch sensing electrode faces away from the first pressure sensing electrode,
the first touch sensing electrode has a first width measured from the first surface of the first touch sensing electrode to the second surface of the first touch sensing electrode at a first location adjacent to the first protruding portion,
the first touch sensing electrode has a second width, different than the first width, measured from the first surface of the first touch sensing electrode to the second surface of the first touch sensing electrode at a second location adjacent to the second protruding portion, and
the first touch sensing electrode, the second touch sensing electrode, and the pressure sensing pattern layer do not overlap in a direction perpendicular to a top surface of the substrate facing the first touch sensing electrode, the second touch sensing electrode, and the pressure sensing pattern layer.

13. The pressure sensing input device of claim 12, wherein each of the pressure sensing electrodes has a line width in a range from 10 μm to 400 μm.

14. The pressure sensing input device of claim 12, wherein the pressure sensing electrodes are made of indium tin oxide (ITO), indium tin oxide doped Ag, silver nanowires, graphene, nano metal meshes carbon nanotubes, or combinations thereof.

15. The pressure sensing input device of claim 12, wherein:
each of the pressure sensing electrodes is electrically connected to a Wheatstone bridge circuit,
a resistance of each of the pressure sensing electrodes is an element of the Wheatstone bridge circuit, and
when any of the pressure sensing electrodes is touched, a variation of the resistance of the touched pressure sensing electrode is detected by the Wheatstone bridge circuit.

16. The pressure sensing input device of claim 15, wherein:
each of the pressure sensing electrodes is electrically connected to the Wheatstone bridge circuit through a first conductive line and a second conductive line.

17. The pressure sensing input device of claim 16, wherein the first conductive line and the second conductive line are made of transparent indium tin oxide (ITO), silver nanowires, copper nanowires nano metal meshes, graphene, polyaniline, 3, 4-ethylenedioxythiophene (PEDOT), carbon nanotubes, or combinations thereof.

18. The pressure sensing input device of claim 12, wherein the pressure sensing electrodes are made of indium tin oxide doped Ag.

19. The pressure sensing input device of claim 12, wherein:
the second touch sensing electrode and the first touch sensing electrode are disposed in a complementary pattern, and
the second touch sensing electrode and the first pressure sensing electrode are interleaved with the first touch sensing electrode.

20. The pressure sensing input device of claim 12, wherein:

the width of the space between the first touch sensing electrode and the first protruding portion is measured from the first surface of the first touch sensing electrode to a first surface of the first protruding portion facing the first touch sensing electrode, and
the width of the space between the first touch sensing electrode and the second protruding portion is measured from the first surface of the first touch sensing electrode to a first surface of the second protruding portion facing the first touch sensing electrode.

* * * * *